(12) United States Patent
Subramanian et al.

(10) Patent No.: US 7,517,558 B2
(45) Date of Patent: Apr. 14, 2009

(54) METHODS FOR POSITIONING CARBON NANOTUBES

(75) Inventors: Krupakar Murali Subramanian, Boise, ID (US); Neal Rueger, Boise, ID (US); Gurtej Sandhu, Boise, ID (US)

(73) Assignee: Micron Technology, Inc., Boise, ID (US)

( * ) Notice: Subject to any disclaimer, the term of this patent is extended or adjusted under 35 U.S.C. 154(b) by 738 days.

(21) Appl. No.: 11/146,248

(22) Filed: Jun. 6, 2005

(65) Prior Publication Data

US 2006/0275549 A1 Dec. 7, 2006

(51) Int. Cl.
*H05H 1/24* (2006.01)
*B05D 1/32* (2006.01)
*C23C 16/00* (2006.01)

(52) U.S. Cl. .................. 427/282; 427/569; 118/715

(58) Field of Classification Search .............. None
See application file for complete search history.

(56) References Cited

U.S. PATENT DOCUMENTS

| | | | |
|---|---|---|---|
| 5,536,677 A * | 7/1996 | Hubacher | 438/613 |
| 6,777,880 B2 * | 8/2004 | Morfill et al. | 315/111.21 |
| 6,803,159 B2 * | 10/2004 | Enloe | 430/5 |
| 6,974,926 B2 * | 12/2005 | Zhang et al. | 209/129 |
| 7,074,694 B2 * | 7/2006 | Kuwahara et al. | 438/455 |
| 2002/0059903 A1 * | 5/2002 | Hasegawa et al. | 118/504 |
| 2003/0038034 A1 * | 2/2003 | Griego et al. | 205/89 |
| 2003/0186522 A1 * | 10/2003 | Duan et al. | 438/584 |
| 2003/0199100 A1 * | 10/2003 | Wick | 436/153 |
| 2003/0211502 A1 * | 11/2003 | Sauer et al. | 435/6 |
| 2004/0151672 A1 * | 8/2004 | Yoshida et al. | 424/46 |
| 2005/0266151 A1 * | 12/2005 | Li-Ren | 427/64 |
| 2006/0146327 A1 * | 7/2006 | Wang et al. | 356/338 |

* cited by examiner

*Primary Examiner*—Timothy H Meeks
*Assistant Examiner*—Joseph Miller, Jr.
(74) *Attorney, Agent, or Firm*—Wells St. John P.S.

(57) ABSTRACT

The present invention is generally directed to a system for controlling placement of nanoparticles, and methods of using same. In one illustrative embodiment, the device includes a substrate and a plurality of funnels in the substrate, wherein each of the funnels comprises an inlet opening and an elongated, rectangular shaped outlet opening. In one illustrative embodiment, the method includes creating a dusty plasma comprising a plurality of carbon nanotubes, positioning a mask between the dusty plasma and a desired target for the carbon nanotubes, the mask having a plurality of openings extending therethrough, and extinguishing the dusty plasma to thereby allow at least some of the carbon nanotubes in the dusty plasma to pass through at least some of the plurality of openings in the mask and land on the target.

3 Claims, 6 Drawing Sheets

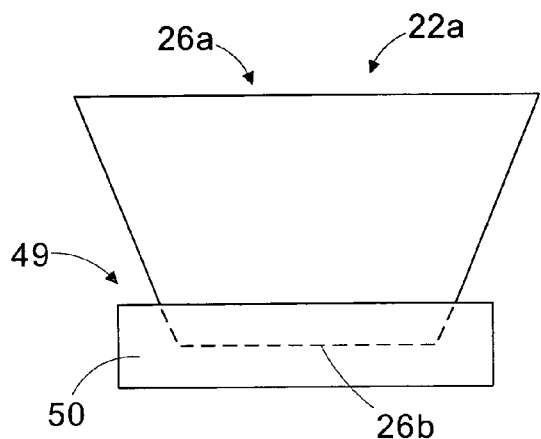
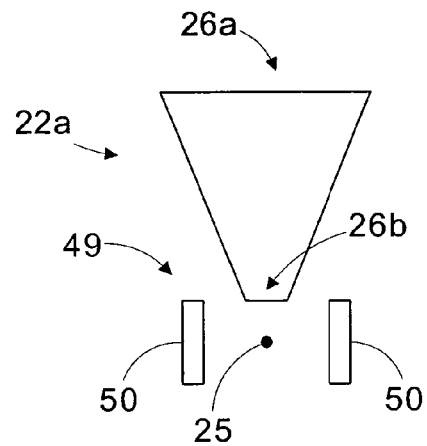
Figure 3A
Figure 3B
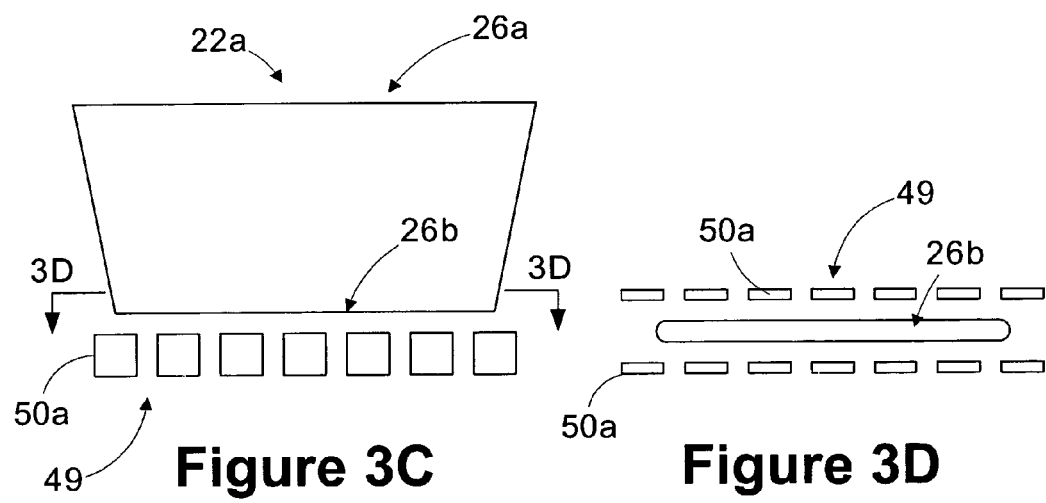
Figure 3C
Figure 3D

METHODS FOR POSITIONING CARBON NANOTUBES

BACKGROUND OF THE INVENTION

1. Field of the Invention

The present invention is generally related to the field of nanoparticle manufacturing techniques, and, more particularly, to a system for controlling placement of nanoparticles, and methods of using same.

2. Description of the Related Art

There is a constant drive in the semiconducting manufacturing industry to improve the performance capabilities of integrated circuit devices and to reduce the manufacturing costs associated with mass production of integrated circuit devices. This constant drive has led engineers and scientists to explore alternative materials and structures for integrated circuit devices, e.g., transistors, diodes, resistors, etc., in an effort to create better performing devices and to reduce the cost of manufacturing such devices.

In recent years, advances have been made with respect to research and development related to nanoparticle structures, such as carbon nanotubes. In general, carbon nanotubes (CNTs) have better semiconducting properties than silicon and are potentially capable of handling very high currents. Carbon nanotube structures are also physically very strong.

Despite these inherent advantages, the use of carbon nanotubes in a variety of industries is limited to the fact that the carbon nanotubes tend to grow only along the electric field gradient and hence normal to the surface of the substrate. This growth characteristic makes the use of carbon nanotubes problematic in some applications in the semiconductor manufacturing industry. For example, the vertical growth characteristics of the carbon nanotubes makes their use in horizontal trenches formed in a semiconducting substrate difficult.

What is desired is a system and methods for accurately placing nanoparticles, e.g., carbon nanoparticles, at desired locations. Such a system and methods will advance the use of carbon nanotubes in the field of semiconductor manufacturing as well as in other fields.

The present invention is directed to a system and various methods that may solve, or at least reduce, some or all of the aforementioned problems.

SUMMARY OF THE INVENTION

The following presents a simplified summary of the invention in order to provide a basic understanding of some aspects of the invention. This summary is not an exhaustive overview of the invention. It is not intended to identify key or critical elements of the invention or to delineate the scope of the invention. Its sole purpose is to present some concepts in a simplified form as a prelude to the more detailed description that is discussed later.

The present invention is generally directed to a system for controlling placement of nanoparticles, and methods of using same. In one illustrative embodiment, the device comprises a nanoparticle mask having a plurality of funnels extending therethrough, wherein each of the funnels comprises an inlet opening and an elongated, rectangular shaped outlet opening.

In another illustrative embodiment, the device comprises a nanoparticle mask having a plurality of openings extending therethrough, wherein each of the openings comprises an upper section having an inlet opening and an elongated, rectangular shaped outlet opening and a lower section positioned beneath the upper section.

In one illustrative embodiment, the system comprises a plasma chamber and a positioning mask for controlling the positioning of carbon nanotubes from the plasma chamber passing through the mask.

In one illustrative embodiment, the method includes creating a dusty plasma comprising a plurality of carbon nanotubes, positioning a mask between the dusty plasma and a desired target for the carbon nanotubes, the mask having a plurality of openings extending therethrough, and extinguishing the dusty plasma to thereby allow at least some of the carbon nanotubes in the dusty plasma to pass through at least some of the plurality of openings in the mask and land on the target.

BRIEF DESCRIPTION OF THE DRAWINGS

The invention may be understood by reference to the following description taken in conjunction with the accompanying drawings, in which like reference numerals identify like elements, and in which:

FIGS. 3A-3D are, respectively, side and end views of an illustrative nanoparticle funnel of the present invention depicting one illustrative technique for counting and sizing nanoparticles passing through the nanoparticle funnel;

Figure 1A:
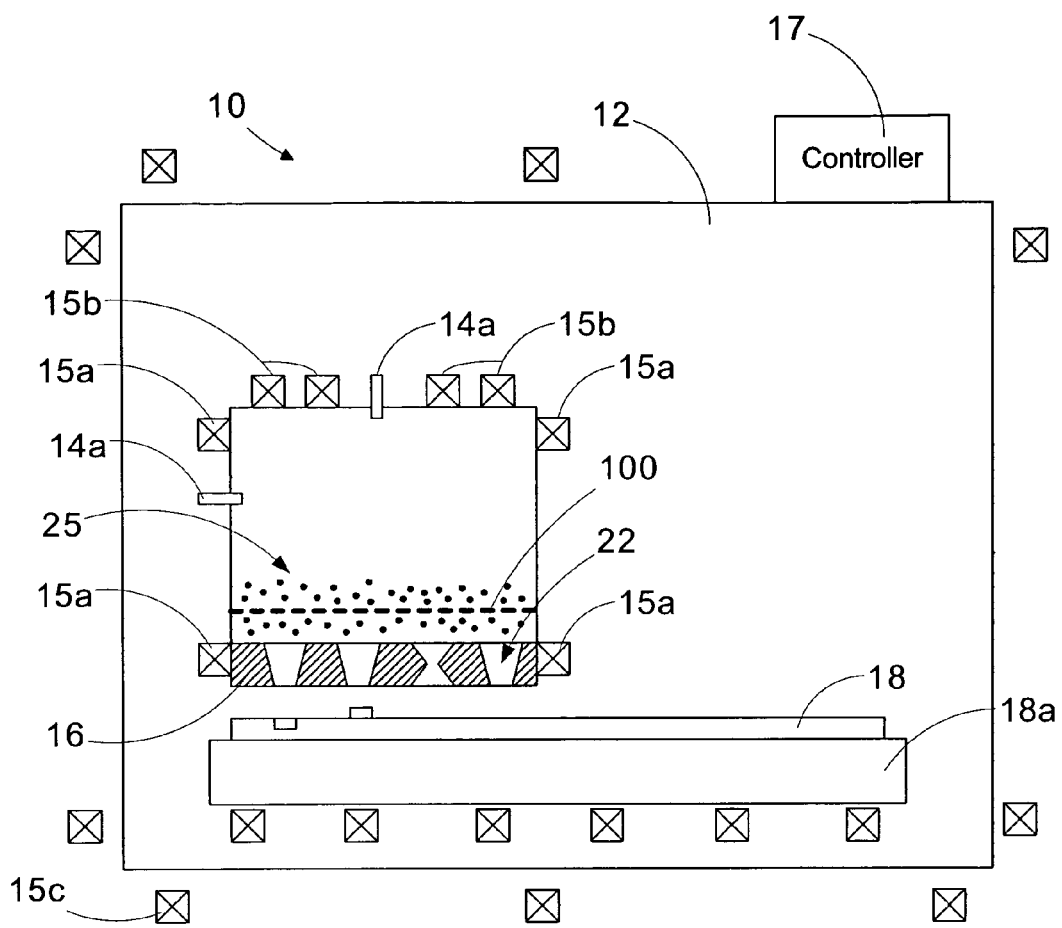
FIG. 1A is a schematic depiction of one illustrative embodiment of an illustrative system in accordance with the present invention.

While the invention is susceptible to various modifications and alternative forms, specific embodiments thereof have been shown by way of example in the drawings and are herein described in detail. It should be understood, however, that the description herein of specific embodiments is not intended to limit the invention to the particular forms disclosed, but on the contrary, the intention is to cover all modifications, equivalents, and alternatives falling within the spirit and scope of the invention as defined by the appended claims.

DETAILED DESCRIPTION OF THE INVENTION

Illustrative embodiments of the invention are described below. In the interest of clarity, not all features of an actual implementation are described in this specification. It will of course be appreciated that in the development of any such actual embodiment, numerous implementation-specific decisions must be made to achieve the developers' specific goals, such as compliance with system-related and business-related constraints, which will vary from one implementation to another. Moreover, it will be appreciated that such a development effort might be complex and time-consuming, but would nevertheless be a routine undertaking for those of ordinary skill in the art having the benefit of this disclosure.

The present invention will now be described with reference to the attached figures. Although the various regions and structures are depicted in the drawings as having very precise, sharp configurations and profiles, those skilled in the art recognize that, in reality, these regions and structures are not as precise as indicated in the drawings. Additionally, the relative sizes of the various features and structures depicted in the drawings may be exaggerated or reduced as compared to the actual size of those features or structures. Nevertheless, the attached drawings are included to describe and explain illustrative examples of the present invention. The words and phrases used herein should be understood and interpreted to have a meaning consistent with the understanding of those words and phrases by those skilled in the relevant art. No special definition of a term or phrase, i.e., a definition that is different from the ordinary and customary meaning as understood by those skilled in the art, is intended to be implied by consistent usage of the term or phrase herein. To the extent that a term or phrase is intended to have a special meaning, i.e., a meaning other than that understood by skilled artisans, such a special definition will be expressly set forth in the specification in a definitional manner that directly and unequivocally provides the special definition for the term or phrase.

Figure 1B:
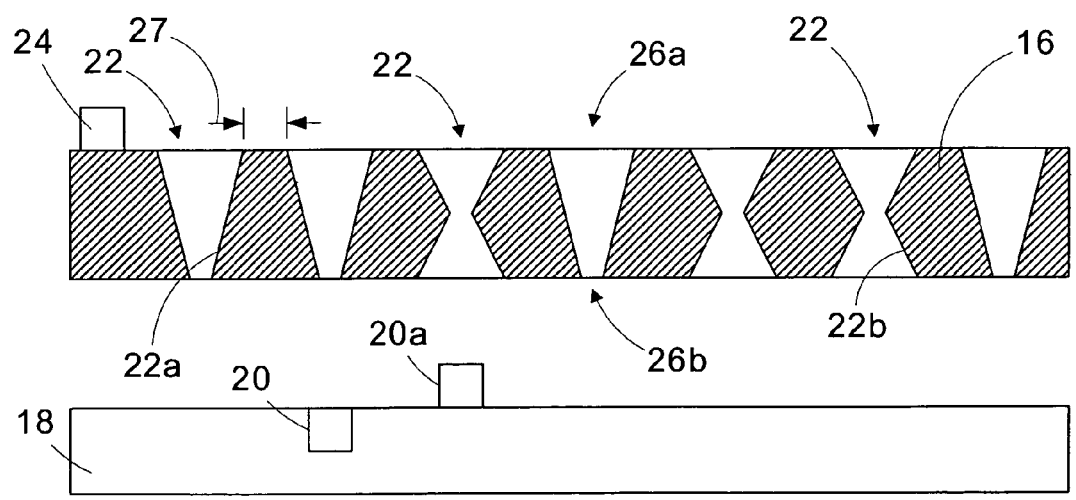
FIG. 1B is an enlarged view of one illustrative embodiment of a nanoparticle mask in accordance with one illustrative embodiment of the present invention.

FIG. 1A depicts one illustrative embodiment of a system 10 that may employ various aspects of the present invention. FIG. 1B is an enlarged, cross-sectional view of one illustrative embodiment of a nanoparticle mask that may be employed in the system 10. As shown in these drawings, the system 10 comprises a housing 12 having a nanoparticle plasma chamber 14 positioned therein, a nanoparticle mask 16, a semiconducting substrate 18, and a controller 17. The substrate 18 is positioned on an electrostatic chuck 18a. In some embodiments, means may be provided (not shown) for providing relative movement between the substrate 18 and the chamber 14 and/or the housing 12, e.g., known robotic handling or stepping systems. A mesh 100 is provided within the chamber 14. A plurality of coils 15a, 15b, 15c may be positioned adjacent the plasma chamber 14, the housing 12 and/or the chuck 18a. The coils 15a, 15b, 15c may be energized to produce a magnetic field that may assist in aligning and orienting the nanoparticles 25 within the chamber 14.

In operation, a plasma will be generated within the chamber 14. Capacitive coupling techniques may be employed to generate the plasma. For example, capacitive coupling may be provided by either the mesh 100 positioned above the nanoparticle mask 16, a combination of the mesh 100 and mask 16, or simply the nanoparticle mask 16. An inductively coupled plasma could also be used independently or in combination with other forms of ionization. Electron cyclotron (ECR) plasma generation techniques may also be employed. The coils 15a, 15b, 15c, e.g., electromagnets, could be used in combination or separately to generate a plasma within the chamber 14, and they may be used in combination with or separately from other ionization sources. The coils 15a, 15b, 15c may also be used to control the orientation and distribution of the particles 25. For example, the coils 15a, 15b, 15c may be independently used to control the velocity distribution of the particles 25.

Also depicted in FIG. 1A are a plurality of inlets 14a to allow the introduction of nanoparticles into the chamber 14, which may be introduced in either aerosol or powder form. The nanoparticle plasma chamber 14 may be employed with any of a variety of different kinds of nanoparticle structures, e.g., carbon nanotubes, nanocrystals, micron-sized particles less than 10 microns in size, etc. Such nanoparticles may be generated in accordance with any of a variety of known techniques. As the name implies, nanoparticles are very small. For example, carbon nanotubes may have an internal diameter ranging from approximately 0.6-5 nm and a length ranging from approximately 1-2 microns. The present invention is directed to manipulating and controlling the placement of these very small nanoparticles.

FIG. 1B is an enlarged view of an illustrative nanoparticle mask 16 that may be employed with the present invention. The nanoparticle mask 16 will be used to position or locate nanoparticles from the nanoparticle plasma chamber 14 on or into desired regions of the substrate 18. The substrate 18 may be made of a variety of materials, e.g., silicon, silicon germanium, $GaN_i$, GaAs, SiC, etc., and it may be doped or undoped depending on the particular application. Additionally, the substrate 18 may have one or more features formed above or in the substrate 18. For example, FIG. 1B schematically depicts an illustrative trench 20 formed in the substrate 18 as well as a raised feature 20a.

The nanoparticle mask 16 may have a plurality of openings formed therethrough for positioning nanoparticles at desired locations on the substrate 18. In the illustrative embodiment depicted herein, the mask 16 has a plurality of openings for this purpose. The mask 16 may further comprise schematically depicted associated control circuitry 24 for controlling various operational aspects of the nanoparticle mask 16, as will be described more fully below. In general, the nanoparticle funnels 22 have an inlet opening 26a and an outlet opening 26b. In operation, schematically depicted nanoparticles 25 will pass through the nanoparticle funnels 22 and be precisely located at desired positions on the substrate 18. In general, the nanoparticle mask 16 will typically be physically smaller than the substrate 18, although that may not be the case in all applications. In the case where the nanoparticle mask 16 is physically smaller than the substrate 18, relative movement may be provided between the substrate 18 and the mask 16/chamber 14 to enable the nanoparticles 25 to be positioned at any desired location on the substrate 18. For example, known mechanical systems may be employed to move the substrate 18 relative to the mask 16/chamber 14 such that the nanoparticles 25 may be located at desired regions across the surface of the substrate 18. The plasma chamber 14 and the chamber 12 may be integrated into a single unit.

In the illustrative embodiment depicted in FIG. 1B, the nanoparticle mask 16 is comprised of two different types of nanoparticle funnels 22. The nanoparticle funnels 22a have a generally V-shaped cross-sectional configuration while the nanoparticle funnels 22b have an hourglass-shaped cross-sectional configuration. Of course, the description of the nanoparticle funnels 22a, 22b as having, respectively, a V-shaped or hourglass-shaped cross-sectional configuration is intended only to provide an introductory explanation of differing embodiments of the present invention. Thus, such descriptions should not be considered a limitation of the present invention.

Figure 2A:
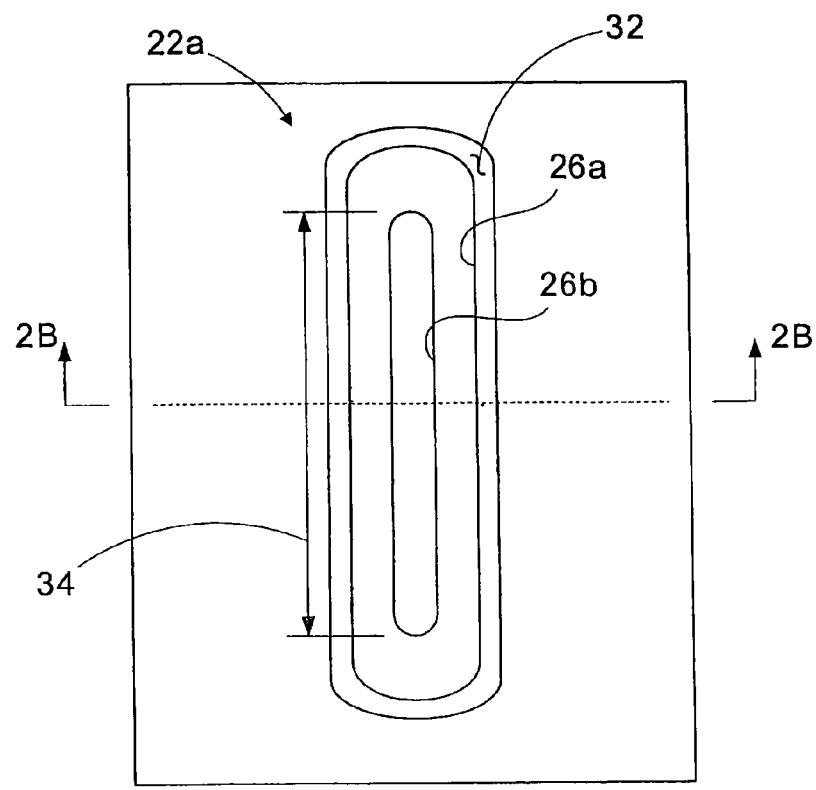
FIGS. 2A-2D are enlarged views of one illustrative embodiment of a nanoparticle funnel in accordance with one illustrative aspect of the present invention.
Figure 2B:
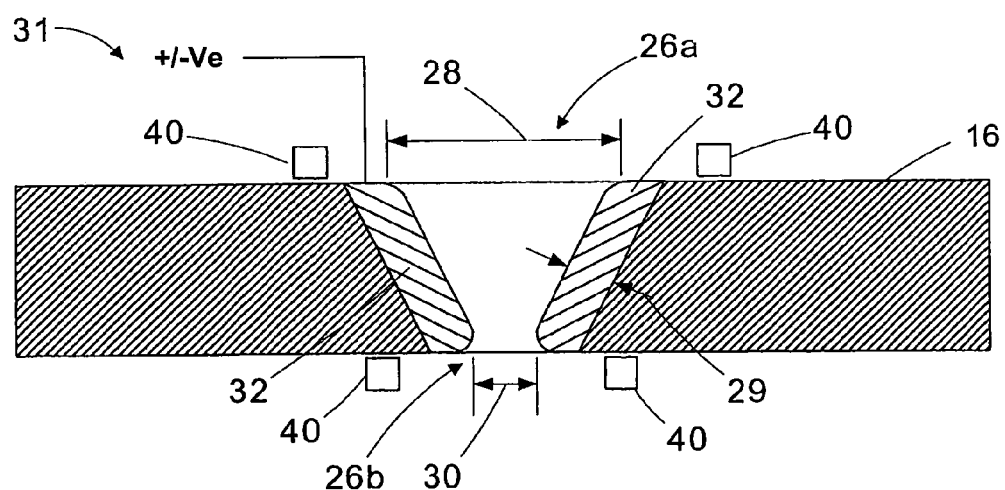
Figure 2C:
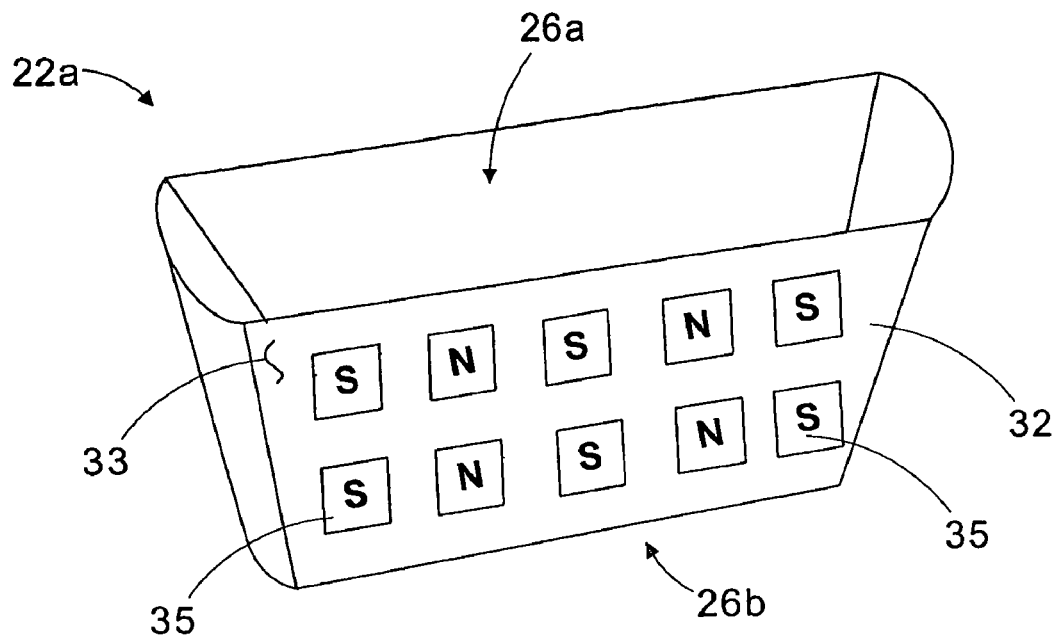
Figure 2D:
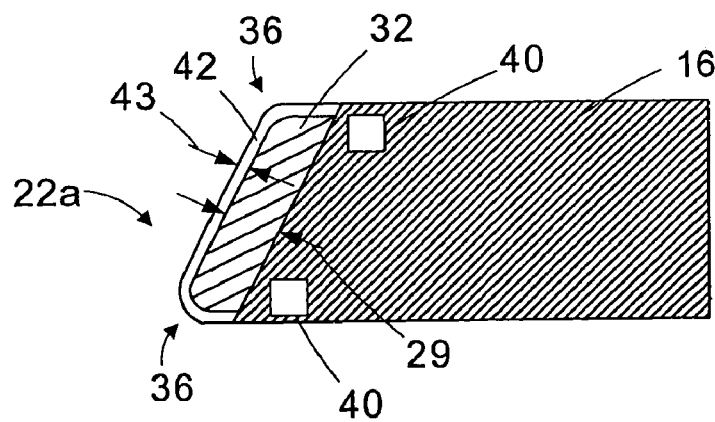

FIGS. 2A-2D depict various enlarged views of one illustrative embodiment of a nanoparticle funnel 22a that may be employed with the present invention. More specifically, FIG. 2A is a plan view, FIG. 2B is a cross-sectional side view, FIG. 2C is a side, perspective view and FIG. 2D is an enlarged cross-sectional side view of a portion of an illustrative nanoparticle funnel 22a.

As shown in FIGS. 2A-2B, the nanoparticle funnel 22a has an elongated oval-type configuration. The nanoparticle funnel 22a comprises a conductive member 32 positioned or formed in the nanoparticle mask 16. The nanoparticle funnel 22a has an elongated inlet opening 26a with a width 28, an elongated, rectangular shaped outlet opening 26b with a width 30, and an overall length 34. The dimensions 28, 30 and 34 may vary depending on the particular application. In one illustrative embodiment, the width 28 of the inlet opening 26a may be approximately 1 µm. The width 30 of the outlet opening 26b may be approximately 1-2 times the size of the nanoparticles that will pass therethrough. In the illustrative embodiment where carbon nanotubes will pass through the outlet opening 26b, the width 30 may range from approximately 1-10 nm. The length 34 of the outlet opening 26b may be approximately 1.5-3 µm.

The conductive member 32 may be comprised of a variety of different materials, e.g., a metal, doped polysilicon, etc. The thickness 29 of the conductive member 32 may also vary depending on the particular application. In one illustrative embodiment, the thickness 29 of the conductive member 32 may be on the order of approximately 100-200 Å. As depicted in FIG. 2B, a voltage supply 31 (±Ve) may be operatively coupled to the conductive member 32 for purposes to be more fully described below.

Also depicted in FIG. 2B are a plurality of coils 40 positioned adjacent the surface of the nanoparticle mask 16 adjacent the conductive member 32. The coils 40 may be positioned adjacent the surface of the mask or embedded within the mask, as illustratively depicted in FIG. 2D. As will be described more fully below, the coils 40 may be employed to generate a magnetic field that may be used to control various operational aspects of the nanoparticle funnel 22a. The number, size and placement of the coils 40 may vary depending on the particular application. In general, the size and placement of the coils 40 should be such that the magnetic field produced by energizing the coils 40 can accomplish the purposes described herein. In one particularly illustrative embodiment, the coils 40 are single turn coils comprised of a single wire having a diameter of approximately 1 micron. Additionally, in this illustrative disclosed embodiment, the coils 40 are positioned adjacent the upper and lower surfaces of the nanoparticle mask 16. However, if desired, the coils 40 could be embedded in the nanoparticle mask 16.

FIG. 2C depicts an alternative embodiment for providing the structure needed to generate a magnetic field that may be employed in operating the nanoparticle funnel 22a. As shown in FIG. 2C, a plurality of coils 35 are formed on the face 33 of the conductive member 32. Of course, such coils 35 would also be formed on the opposite face (not shown) of the conductive member 32 on the opposite side of the nanoparticle funnel 22a. For convenience, these additional coils 35 are not depicted in FIG. 2C. The coils 35 may be employed in generating a magnetic cusp field as desired for operational purposes. If desired, such coils 35 may be formed on the narrower or shorter sides of the nanoparticle funnel 22a, but such coils 35 would likely have to rely on the magnetic fields generated by the coils 35 on the larger sides of the nanoparticle funnel 22a to spread the magnetic fields. The polarity ("S." "N") of the magnetic fields within the coils 35 is provided by way of example only.

FIG. 2D is an enlarged view of a portion of the illustrative nanoparticle funnel 22a. FIG. 2D is provided to provide further details regarding the possible structure of the nanoparticle funnel 22a. More specifically, as shown therein, a layer of insulating material 42, e.g., silicon dioxide, silicon nitride, etc., is formed on the conductive member 32. The layer of insulating material 42 may be employed in some embodiments in an effort to reduce the possibility that a charged nanoparticle (not shown in FIG. 2D) passing through the nanoparticle funnel 22a will contact the conductive member 32 and lose its charge. When employed, the layer of insulating material 42 may have a thickness 43 of approximately 100 Å. Additionally, in one illustrative embodiment, the corners 36 of the conductive member 32 should be provided with a radius to eliminate or reduce the concentration of the electrical and/or magnetic fields that may be generated during the operation of the nanoparticle mask 16 as described more fully below. The degree of rounding of the corners 36 may vary depending upon the particular application.

During operation, it may be desirable to count the approximate number of nanoparticles and/or the size as such nanoparticles pass through the illustrative nanoparticle funnels 22 described herein. FIGS. 3A-3D are enlarged, exaggerated views of illustrative structures that may be employed in counting and/or sizing nanoparticles 25 as they pass through the nanoparticle funnels 22 described herein. More specifically, FIGS. 3A and 3B are, respectively, a side view and an end view of an illustrative nanoparticle funnel 22a that employs a parallel plate capacitor structure 49, i.e., a plurality of spaced-apart parallel plates 50 to detect a nanoparticle 25 (see FIG. 3B) passing through the nanoparticle funnel 22a. The size of the spacing between the parallel plates 50 is exaggerated in FIG. 3B for purposes of explanation. As will be described more fully below, the spaced-apart conductive plates 50 may be employed to detect a change in capacitance as the nanoparticle 25 passes through the spaced-apart plates 50. As indicated in FIGS. 3A-3B, the plates 50 are positioned adjacent the outlet opening 26b of the nanoparticle funnel 22a. The size and configuration of the plates 50 may vary depending upon the particular application. The plates 50 may be comprised of any conductive material. The physical size of the conductive plates 50 may vary depending upon the particular application. In general, the conductive plates 50 should have a length slightly greater than the length 34 of the outlet opening 26b, i.e., slightly larger than the anticipated length of the nanoparticles 25 that will pass through the opening 26b. Moreover, if employed, the corners of the conductive plates 50 may be rounded to reduce or prevent unwanted concentration of electric fields. The spacing between the plates 50 may also vary depending upon the particular application. For example, the spacing between the conductive plates 50 may be slightly larger than the width 30 of the outlet opening 26b, i.e., slightly greater than the width or diameter of the nanoparticles 25 that will pass through the opening 26b.

FIGS. 3C-3D depict an illustrative structure that may be employed in determining the approximate length of the nanoparticles 25 passing through the nanoparticle funnel 22 described herein. More specifically, FIGS. 3C-3D depict the use of a plurality of spaced-apart conductive plates 50a that are positioned adjacent the outlet opening 26b of the nanoparticle funnel 22a depicted therein. As with the embodiment depicted in FIGS. 3A-3B, the spaced-apart plates 50a will be employed to detect a change in capacitance as a nanoparticle 25 passes through the nanoparticle funnel 22a. However, since there are a plurality of conductive plates 50a spaced along each side of the outlet opening 26b, the lengthwise size of the nanoparticle 25, or at least a close approximation thereof, may be obtained by use of the structure depicted in FIGS. 3C and 3D. More specifically, the plurality of spaced-apart conductive plates 50a will only detect a change in capacitance if a nanoparticle 25 passes between the plates 50a. Thus, by noting which pairs of spaced-apart plates 50a detect a change in capacitance, the approximate size or length of the nanoparticle 25 passing through the nanoparticle funnel 22a may be detected.

The illustrative plates 50, 50a depicted in FIGS. 3A-3D may be formed in the nanoparticle mask 16 adjacent the funnel 22a. Other structures may also be employed to count, detect and/or size the nanoparticles 25. For example, optical devices may be employed. As a specific example, a light source may be positioned on one side of the outlet opening 26b while an optical receiver may be positioned on the opposite side of the outlet opening 26b. The particles may be detected and counted as the nanoparticles pass between the light source and the receiver.

Figure 4:
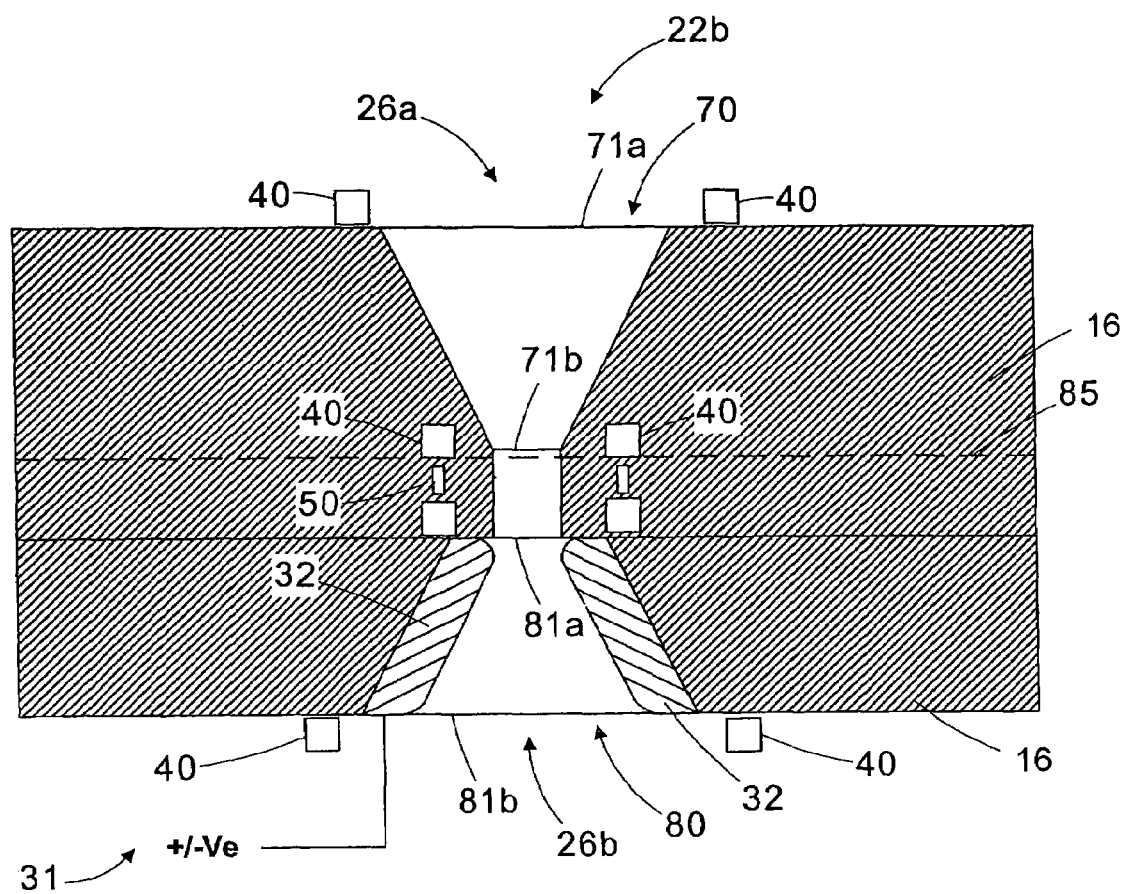
FIG. 4 depicts an alternative embodiment of a nanoparticle funnel in accordance with one aspect of the present invention.

FIG. 4 is a cross-sectional view depicting an alternative embodiment of a nanoparticle funnel 22 in accordance with one aspect of the present invention. The embodiment depicted in FIG. 4 generally corresponds to the hourglass-shaped nanoparticle funnel 22b schematically depicted in FIG. 1. As shown in FIG. 4, the nanoparticle funnel 22b has an inlet opening 26a and an outlet opening 26b. The nanoparticle funnel 22b comprises an upper section 70 and a lower inverted section 80. The upper section 70 comprises an inlet opening 71a and an outlet opening 71b. The lower inverted section 80 has an inlet opening 81a and an outlet opening 81b. Spaced-apart conductive plates 50 are positioned adjacent the outlet 71b to detect and/or size nanoparticles passing through the upper section 70. The plates 50 may have the same structure and operate in a similar fashion to the plates 50, 50a depicted previously with respect to FIGS. 3A-3D. The structure depicted in FIG. 4 may also be formed from three or more sections in other embodiments. For example, the dashed line 85 indicates an illustrative example in which the structure is formed from three components—an upper section, a middle section and a lower section.

In the illustrative example depicted herein, the upper section 70 has a conical-shaped configuration. The upper section 70 may be formed of an insulating material. In one illustrative example, the upper section 70 may be formed directly in the nanoparticle mask 16 (as depicted in FIG. 4) as long as the nanoparticle mask 16 is comprised of an insulating material. In another illustrative embodiment, the desired shape of the upper section 70 may be formed in the nanoparticle mask 16, and a layer of insulating material (not shown) comprised of, for example, silicon dioxide, may be deposited therein. Such a layer of insulating material may have a thickness of approximately 500-1000 Å. Magnetic coils 40 are positioned adjacent the upper section 70 and adjacent the lower inverted section 80. The coils 40 may be positioned as depicted and described above with respect to FIGS. 2B and 2C.

The lower inverted section 80 may comprise a conductive member 32, as described previously with respect to FIGS. 2A-2D. Moreover, a layer of insulating material like the layer 42 depicted in FIG. 2D may be formed on the conductive member 32 depicted in the lower section 80. A voltage supply 31 (±Ve) may also be operatively coupled to the conductive member 32 in the lower inverted section 80. The various components depicted in FIG. 4 may be formed in a single nanoparticle mask substrate or the upper section 70 and the lower inverted section 80 may be formed in separate nanoparticle mask substrates that are bonded to one another. It should also be noted that the illustrative inverted conical shape of the lower section 80 is provided by way of example only. After a complete reading of the present application, those skilled in the art will recognize that the lower section 80 may be of any desired shape or configuration, e.g., cylindrical, rectangular, etc. Thus, references to the lower section 80 as a lower funnel section should not be understood to imply any structural configuration for the lower section 80.

With reference to FIG. 1, the overall size, shape and configuration of the nanoparticle mask 16 may vary as well as the location of the nanoparticle funnels 22 positioned in the mask 16. For example, the mask 16 may be approximately the same physical size as the substrate 18 or it may be smaller than the substrate 18. The spacing 27 (see FIG. 1B) between adjacent nanoparticle funnels 22 may vary depending upon the particular application. Typically, the nanoparticles 25 within the plasma have an ordered lattice spacing, which will vary depending upon the particular application. In one illustrative embodiment, the spacing 27 between the edges of adjacent inlet openings 26a of the nanoparticle funnels 22 should be approximately equal to the anticipated lattice spacing between nanoparticles 25 in the plasma. Such spacing will tend to insure that at least one nanoparticle 25 falls in each of the nanoparticle funnels 22 when the plasma is extinguished.

Figure 5A:
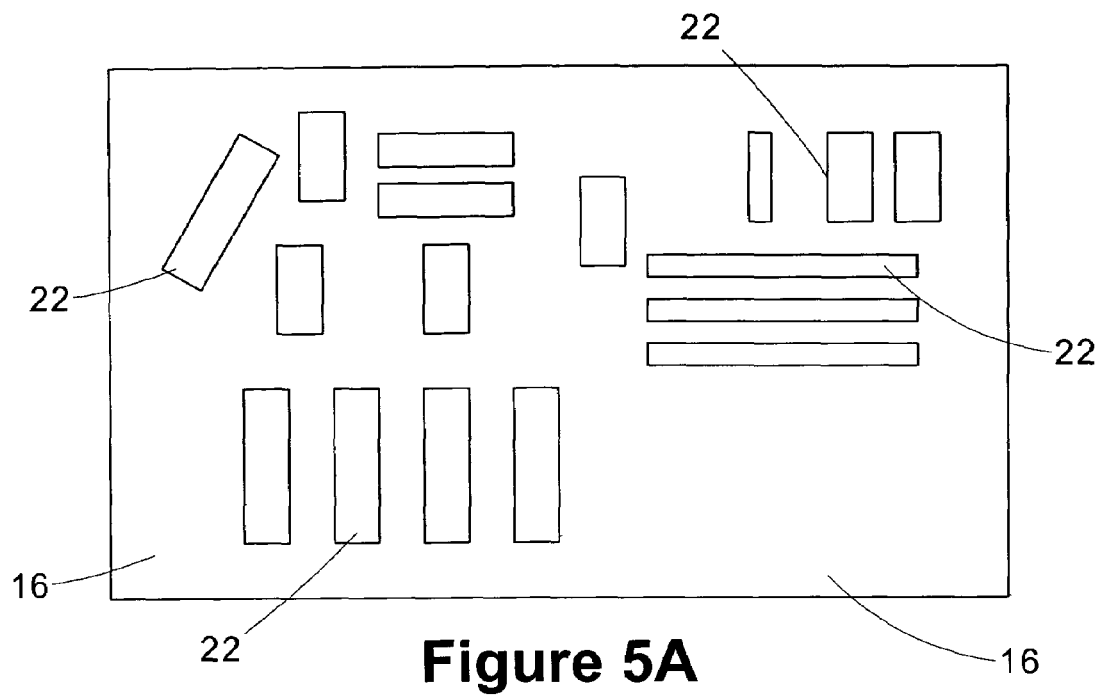
FIGS. 5A-5B depict plan views of illustrative examples of nanoparticle masks in accordance with illustrative aspects of the present invention.
Figure 5B:
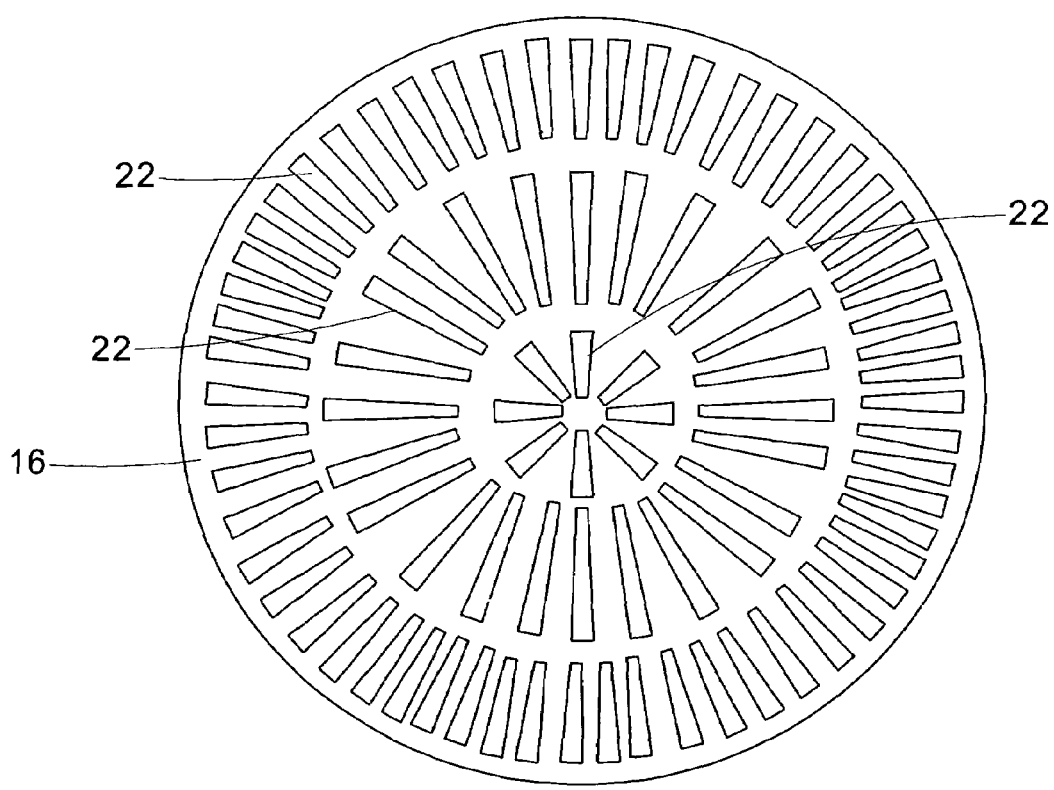

As indicated previously, the location of the nanoparticle funnels 22 on the mask 16 may vary depending upon the particular application. The nanoparticle funnels 22 may be arranged in an ordered or random fashion. FIGS. 5A-5B depict illustrative examples of a nanoparticle mask 16 that has various layouts of the nanoparticle funnels 22. FIG. 5A is a plan view of a nanoparticle mask 16 wherein portions of the mask 16 have schematically depicted nanoparticle funnels 22 arranged in an ordered pattern and other portions of the mask 16 have nanoparticle funnels 22 oriented in a random fashion. For convenience, the outlet opening 26b of the funnels 22 are not depicted in FIGS. 5A-5B. FIG. 5B depicts an alternative embodiment of a mask 16 wherein a plurality of schematically depicted nanoparticle funnels 22 are uniformly distributed across the mask 16. The mask 16 depicted in FIG. 5B may be employed to uniformly distribute nanoparticles 25 across all or a portion of the substrate 18. For example, the mask 16 depicted on FIG. 5B may be rotated as desired to uniformly deposit nanoparticles 25 across the surface of the substrate 18. The rotation of the mask 18 depicted in FIG. 5B may be accomplished using known mechanical techniques and systems.

It should also be understood that the nanoparticle mask 16 described herein may also be programmable in nature. That is, as described more fully below, by application of various electrical and magnetic fields, the nanoparticles 25 may be re-oriented and/or blocked from passing through one or more of the nanoparticle funnels 22 on the mask 16. The ability to, if desired, program a nanoparticle mask 16 may enable the use of a generic mask 16 wherein various nanoparticle funnels 22 are effectively blocked so as to achieve a desired pattern in the nanoparticle mask 16.

The operation and use of various aspects of the present invention will now be described. After the nanoparticles 25, e.g., carbon nanotubes, are manufactured and collected using known techniques, the nanoparticles 25 may be positioned in the plasma chamber 14 after a plasma is generated. For example, a plasma may be generated with the chamber 14 (see FIG. 1) using known techniques, and the nanoparticles 25 may be introduced into the plasma via an aerosol spray. Nanoparticles 25, such as carbon nanotubes, in a plasma environment form what is generally referred to as a dusty plasma. The nanoparticles 25 within the plasma are charged by collecting ions and electrons, or by photoemissions and secondary emissions. A dusty plasma generated with carbon nanotubes in the chamber 14 can suspend the charged nanoparticles 25 within the dusty plasma. The orientation and alignment of the nanoparticles 25 within the dusty plasma may be influenced, at least to some degree, by the application of a magnetic field to the plasma via the coils 15. By applying various magnetic fields to the plasma, the nanoparticles may be manipulated to at least some degree. For example, by applying the appropriate magnetic field, via the coils 15, the nanoparticles suspended in the plasma can cause the nanoparticles 25 to rotate. In one case, the nanoparticles 25 may exhibit rigid body rotation where substantially all of the nanoparticles move at approximately constant angular velocity. In another case, the nanoparticles 25 may exhibit a sheared rotation wherein the angular velocity of the nanoparticles has a radical distribution.

The nanoparticles 25 remain suspended in the dusty plasma until the plasma is extinguished. Once the plasma is extinguished, the present invention may be employed to control the fall of the nanoparticles 25, e.g., carbon nanotubes, toward the substrate 18. More specifically, in one illustrative embodiment, the nanoparticle funnels 22 may be employed to insure that a single carbon nanotube falls through each of the nanoparticle funnels 22 described herein. In general, various electrical and magnetic fields may be employed to control the passage of nanoparticles through the nanoparticle funnels 22.

Figure 6:
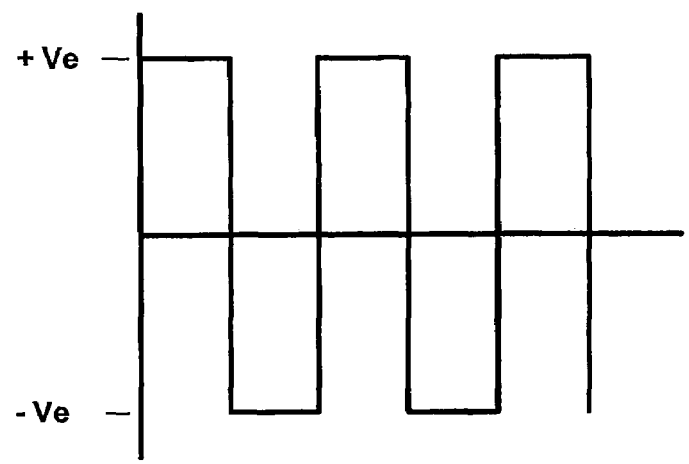
FIG. 6 depicts an illustrative voltage that may be applied to the nanoparticle funnels of the present invention.

In some embodiments of the present invention, various structures may be employed to generate various magnetic fields and/or electrical fields. However, such electrical and magnetic fields may not be required in all applications. In accordance with one aspect of the present invention, various electric fields may be generated to control various operational aspects of the present invention. For example, electrical fields may be employed to attract or repel charged nanoparticles 25 toward or from the funnels 22. In one illustrative example, an electric field is created by applying a voltage to the conductive member 32 of the nanoparticle funnels 22a, 22b described herein. As indicated in FIGS. 2B and 4, a voltage (±Ve) may be applied to the conductive member 32. FIG. 6 depicts an illustrative pulsed signal in which positive (+Ve) and negative (−Ve) signals are supplied to the conductive member 32. The magnitude of the voltage levels (±Ve) may vary depending upon the particular application. In one illustrative embodiment, the voltage levels may vary from +100 volts to −100 volts. The duration between pulses may also vary and the voltage applied to the conductive member 32 need not be constant, i.e., the voltages applied may be irregular in terms of voltage levels and duration.

During the positive (+Ve) portion of the AC signal depicted in FIG. 6, the negatively charged nanoparticles 25, e.g., carbon nanotubes, are attracted toward the nanoparticle funnel 22. However, during the negative (−Ve) portion of the AC signal depicted in FIG. 6, the charged nanoparticles would be repelled, i.e., they would experience an upward thrust that would tend to prevent the charged nanoparticles 25 from adhering to the walls or structure of the nanoparticle funnel 22. Application of the positive voltage (+Ve) to the conductive member 32 would keep the charged particles moving toward the nanoparticle funnels 22. The number of pulses applied, the frequency and the amplitude of the pulse waveform would dictate the number and timing of nanoparticles 25 reaching the nanoparticle funnels 22. The waveform may be of any desired shape, e.g., square, sawtooth, sinewave, etc.

The required electric field strength for controlling the nanoparticles 25 is believed to be relatively small. First, a typical nanoparticle contains approximately $10^6$ carbon (C) atoms, with each using 12 amu. The mass of the carbon atoms in a single nanoparticle, e.g., a carbon nanotube, may be approximately $19.92 \times 10^{-21}$ kg ($10^6$ C atoms×12 amu/C atoms×$1.66 \times 10^{-27}$ kg/amu). The required electrical field is given by the following known formula:

$$F = Eq = mg$$

-continued where $E$ = Electric Field (V/$M$)

$q$ = Electron Charge ($1.6 \times 10^{19} C$)

$m$ = Mass (kg)

$g$ = Gravity (m/sec$^2$)

$$E = \frac{mg}{q} = 12.45 \times 10^{-2} \text{ V/m}$$

As can be seen from the foregoing equation, the size of the electric field employed in manipulating the nanoparticles 25 is relatively small. Thus, signals of very low amplitude may be employed in manipulating or regulating the flow of nanoparticles 25 through the nanoparticle funnels 22 disclosed herein. It should be further noted that the magnitude of the above-calculated electric field decreases if the charged nanoparticles 25 hold multiple charges.

The present invention may also employ magnetic fields to control various operational aspects of the nanoparticle funnels 22 described herein, although such magnetic fields are not required in all applications. In the disclosed embodiment, a plurality of coils 40 are employed to generate the desired magnetic fields. The magnetic fields are generated for a variety of purposes. For example, the magnetic field may be employed to orient the nanoparticles that will be allowed to pass through the nanoparticle funnels 22. Such magnetic fields may also be employed to effectively repel or block nanoparticles 25 from entering the nanoparticle funnels 22.

As indicated previously, the present invention may also employ various arrangements of spaced-apart conductive plates 50, 50a (see FIGS. 3A-3D) for purposes of counting and/or sizing nanoparticles 25 passing through a nanoparticle funnel 22. The spacing between the parallel plate structures is very small and the nanoparticles 25, e.g., carbon nanotubes, passing therebetween occupies a significant volume of the space between the parallel plates 50, 50a. This occurs because the spacing between the parallel plates is comparable to the diameter of the carbon nanotube, e.g., approximately 1-6 nm.

The capacitance of a parallel plate capacitor is given by:

$$C = \frac{k\varepsilon_0 A}{d}$$

where A is the surface area, d is the distance of separation, $\varepsilon_o$ is the permittivity of free space, and k is the dielectric constant of the material separating the two plates. For vacuum k~1, otherwise it is greater than 1.

The charge on a capacitor is given by:

$$Q = C \cdot V$$

Thus, the voltage varies with capacitance as set forth in the following equation:

$$V = \frac{Qd}{k\varepsilon_0 A}$$

If the charge (Q) is constant, then the voltage (V) varies inversely with the dielectric constant (k). Since the dielectric constant (k) is greater than one for any material, the voltage (v) decreases as the nanoparticle 25 passes through the parallel plate capacitor structure 49, i.e., the parallel plates 50, 50a. This change in voltage may be detected and represents a nanoparticle falling through the nanoparticle funnel 22. This principal applies equally as well to the parallel plate capacitor structure 49 comprised of the plurality of plates 50a as shown in FIGS. 3C and 3D. Once a nanoparticle 25 is detected by the parallel plate capacitor structure 49, the controller 17 can immediately apply a negative voltage (−Ve) to the conductive member 32 to prevent all other nanoparticles from passing through the nanoparticle funnel 22. Thus, the system disclosed herein may be employed to precisely regulate the number of nanoparticles that are allowed to pass through each of the nanoparticle funnels 22 that comprise the nanoparticle mask 16. The plates 50, 50a could be replaced with light emitting diodes on one side and one or more detectors on the opposite side. The falling nanoparticles scatter the light reaching the detector. This scattering can be sensed and an appropriate signal can be sent to the controller.

The controller 17 and the control circuitry 24 may be employed to control the operational aspects of the systems described herein. More specifically, the controller 17 may employ various software control routines to enable it to effectively control each of the nanoparticle funnels 22 in the mask 16. It should be understood that the location of the control circuitry 24 on the mask 16 is provided by way of illustrative example only. In practice, the control circuitry 24 may be at least partially contained in the controller 17 or located elsewhere in the system 10.

The present invention is generally directed to a system for controlling placement of nanoparticles, and methods of using same. In one illustrative embodiment, the device comprises a nanoparticle mask substrate and a plurality of funnels in the nanoparticle mask substrate, wherein each of the funnels comprises an inlet opening and an elongated, rectangular shaped outlet opening.

In another illustrative embodiment, the device comprises a nanoparticle mask and a plurality of openings in the nanoparticle mask substrate, wherein each of the openings comprises an upper section having an inlet opening and an elongated, rectangular shaped outlet opening and a lower section positioned beneath the upper section.

In one illustrative embodiment, the system comprises a plasma chamber and a positioning mask for controlling the positioning of carbon nanotubes from the plasma chamber passing through the mask.

In one illustrative embodiment, the method includes creating a dusty plasma comprising a plurality of carbon nanotubes, positioning a mask between the dusty plasma and a desired target for the carbon nanotubes, the mask having a plurality of openings extending therethrough, and extinguishing the dusty plasma to thereby allow at least some of the carbon nanotubes in the dusty plasma to pass through at least some of the plurality of openings in the mask and land on the target.

The particular embodiments disclosed above are illustrative only, as the invention may be modified and practiced in different but equivalent manners apparent to those skilled in the art having the benefit of the teachings herein. For example, the process steps set forth above may be performed in a different order. Furthermore, no limitations are intended to the details of construction or design herein shown, other than as described in the claims below. It is therefore evident that the particular embodiments disclosed above may be altered or modified and all such variations are considered within the scope and spirit of the invention. Accordingly, the protection sought herein is as set forth in the claims below.

What is claimed is:

1. A method of positioning carbon nanotubes, comprising:
   creating a dusty plasma comprising a plurality of carbon nanotubes;
   positioning a mask between said dusty plasma and a desired target for said carbon nanotubes, said mask having a plurality of openings extending therethrough;
   extinguishing said dusty plasma;
   the carbon nanotubes falling out of the extinguished plasma and toward said mask, the mask patterning the falling carbon nanotubes to form a pattern of the carbon nanotubes on said target;
   wherein said plurality of openings correspond to a plurality of funnels;
   wherein each of said funnels comprises an inlet and an outlet, with the outlet being narrower than the inlet along at least one cross-section; and
   using parallel spaced-apart conductive plates to count nanotubes exiting the outlets of the funnels.

2. The method of claim 1, wherein each of said funnels has a conical cross-sectional configuration.

3. A method of patterning carbon nanotubes, comprising:
   creating a dusty plasma comprising a plurality of carbon nanotubes;
   positioning a mask between said dusty plasma and a target for said carbon nanotubes, said mask having a plurality of openings extending therethrough, some of the openings being substantially funnel shaped and others of the openings being substantially hourglass shaped;
   extinguishing said dusty plasma;
   the carbon nanotubes falling out of the extinguished plasma and toward said mask;
   the falling carbon nanotubes passing through the openings in the mask, and being patterned by said passage through the openings to form a pattern on the target; and
   using parallel spaced-apart conductive plates to count nanotubes exiting the openings.

* * * * *